US012684730B2

(12) United States Patent
Li et al.

(10) Patent No.: US 12,684,730 B2
(45) Date of Patent: Jul. 14, 2026

(54) SILICON-CONTROLLED RECTIFIER WATER-COOLING HEAT DISSIPATION DEVICE

(71) Applicant: Shanghai Kohler Electronics, Ltd., Shanghai (CN)

(72) Inventors: Honggang Li, Shanghai (CN); Yingfeng Wang, Shanghai (CN); Xiaolan Hu, Shanghai (CN)

(73) Assignee: Shanghai KOHLER Electronics, Ltd, Shanghai (CN)

( * ) Notice: Subject to any disclaimer, the term of this patent is extended or adjusted under 35 U.S.C. 154(b) by 924 days.

(21) Appl. No.: 17/980,187

(22) Filed: Nov. 3, 2022

(65) Prior Publication Data

US 2023/0145026 A1     May 11, 2023

(30) Foreign Application Priority Data

Nov. 10, 2021     (CN) .......................... 202122748787.8

(51) Int. Cl.
*H05K 7/20* (2006.01)
(52) U.S. Cl.
CPC ..... *H05K 7/20254* (2013.01); *H05K 7/20272* (2013.01); *H05K 7/20281* (2013.01)
(58) Field of Classification Search
CPC ........... H05K 7/20254; H05K 7/20272; H05K 7/20281; H01L 23/473
See application file for complete search history.

(56) References Cited

U.S. PATENT DOCUMENTS

| | | | | |
|---|---|---|---|---|
| 2004/0011304 A1* | 1/2004 | Herynek | .................. | F01P 11/16 |
| | | | | 123/41.1 |
| 2006/0137863 A1* | 6/2006 | Lee | ........................ | H01L 23/473 |
| | | | | 361/699 |
| 2007/0286689 A1* | 12/2007 | Giannetti | ................ | B23B 27/10 |
| | | | | 407/11 |
| 2018/0295748 A1* | 10/2018 | Ukegawa | ........... | H05K 7/20509 |

* cited by examiner

*Primary Examiner* — Robert G Bachner
(74) *Attorney, Agent, or Firm* — Lempia Summerfield Katz LLC

(57) ABSTRACT

The present disclosure relates to a silicon-controlled rectifier water-cooling heat dissipation device, including: a water-cooling cavity body; a silicon-controlled rectifier; and a heat dissipation plate. The heat dissipation plate includes: a first heat dissipation part configured to contact the water-cooling cavity body; and a second heat dissipation part connected to the first heat dissipation part and configured to contact the silicon-controlled rectifier. A preset included angle is formed between a plane where the first heat dissipation part is located and a plane where the second heat dissipation part is located. The heat of the silicon-controlled rectifier is transferred to the water-cooling cavity body through the heat dissipation plate. An occupied volume can be effectively reduced because the first heat dissipation part and the second heat dissipation part form the included angle. The cooling water takes away the heat by the flowability of the water to improve heat dissipation efficiency.

17 Claims, 4 Drawing Sheets

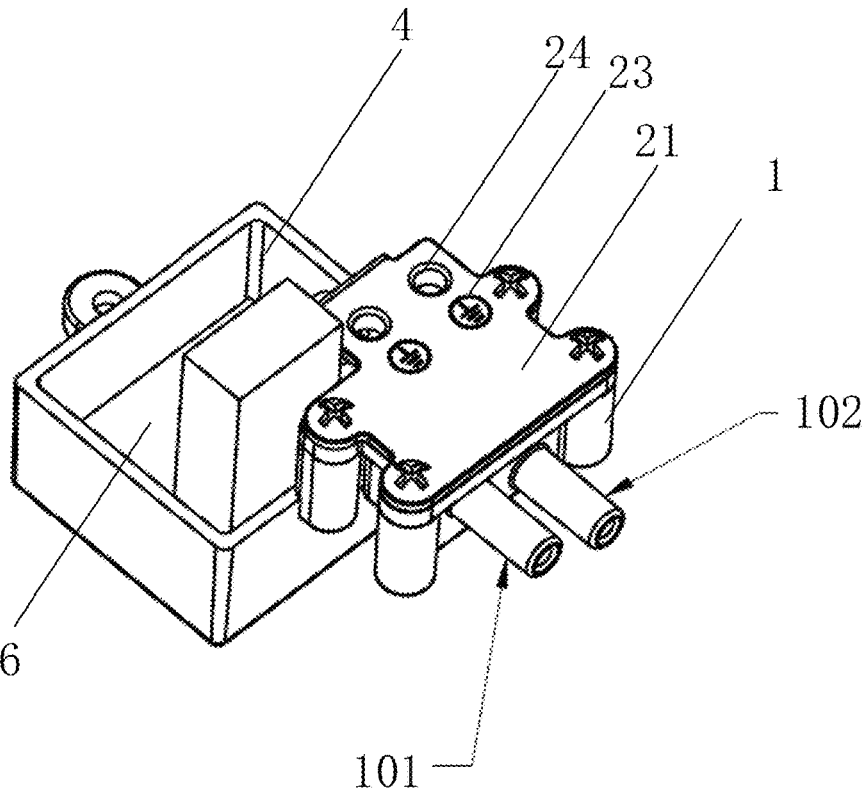

FIG. 2

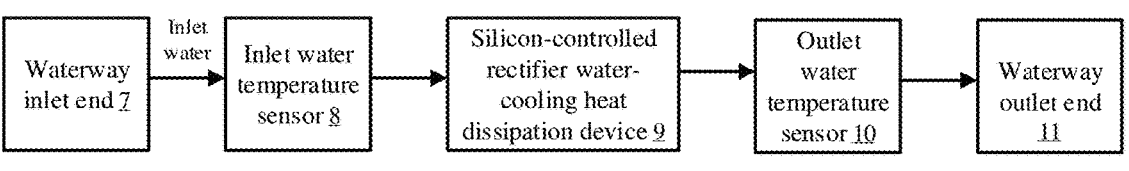

| Waterway inlet end 7 | Inlet water → | Inlet water temperature sensor 8 | → | Silicon-controlled rectifier water-cooling heat dissipation device 9 | → | Outlet water temperature sensor 10 | → | Waterway outlet end 11 |

FIG. 3

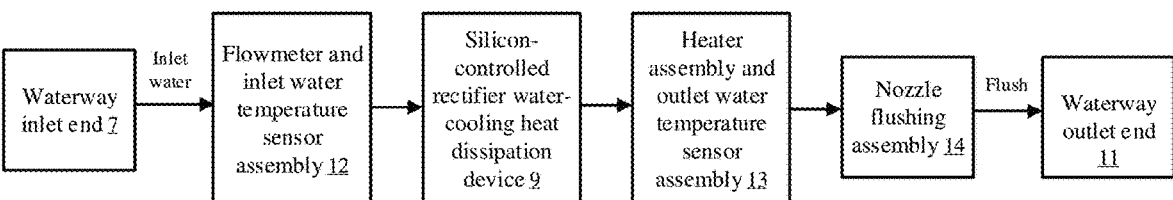

| Waterway inlet end 7 | Inlet water → | Flowmeter and inlet water temperature sensor assembly 12 | → | Silicon-controlled rectifier water-cooling heat dissipation device 9 | → | Heater assembly and outlet water temperature sensor assembly 13 | → | Nozzle flushing assembly 14 | Flush → | Waterway outlet end 11 |

FIG. 4

SILICON-CONTROLLED RECTIFIER WATER-COOLING HEAT DISSIPATION DEVICE

CROSS-REFERENCE TO RELATED APPLICATION

This application claims the benefit of priority to Chinese Patent Application No. 202122748787.8, filed in the Chinese Intellectual Property Office on Nov. 10, 2021, which is hereby incorporated by reference in its entirety.

FIELD

The present disclosure relates to the technical field of bathroom devices, in particular to a silicon-controlled rectifier water-cooling heat dissipation device and a waterway system.

BACKGROUND

A silicon-controlled rectifier, as a switching device, is used in a water heating control circuit and may generate heat during operation. In order to meet the temperature requirements of electronic circuit devices, it is necessary to promote heat dissipation of the silicon-controlled rectifier through external devices.

A heat dissipation mode for the silicon-controlled rectifier adopts heat dissipation fins, which has low efficiency and largely occupies space volume. However, some silicon-controlled rectifiers adopting water-cooling mode have low flexibility in module installation and are assembled on water heaters and directly connected with inlet water temperature sensors. The heat emitted by the silicon-controlled rectifiers directly affect the measurement of the inlet water temperature in a waterway system and thus are harmful to the water temperature in the whole waterway system.

SUMMARY

Based on the foregoing defects, it is necessary to provide a silicon-controlled rectifier water-cooling heat dissipation device and a waterway system to solve the technical problems that the heat dissipation assembly for a silicon-controlled rectifier largely occupies space and has low heat dissipation efficiency and low module installation flexibility.

The present disclosure provides a silicon-controlled rectifier water-cooling heat dissipation device, comprising: a water-cooling cavity body, a metal heat dissipation plate, and a silicon-controlled rectifier. The heat dissipation plate comprises a first heat dissipation part and a second heat dissipation part, which are connected to each other. The first heat dissipation part is in contact with the water-cooling cavity body. The second heat dissipation part is in contact with the silicon-controlled rectifier. A preset included angle is formed between a plane at which the first heat dissipation part is located and a plane at which the second heat dissipation part is located.

Further, the water-cooling cavity body comprises a cavity inlet pipe, a cavity outlet pipe, and a water-cooling cavity with an opening. The cavity inlet pipe and the cavity outlet pipe are respectively communicated with the water-cooling cavity, and the first heat dissipation part covers the opening.

In another embodiment, the silicon-controlled rectifier water-cooling heat dissipation device further comprises a sealing ring arranged between the first heat dissipation part and the opening.

In another embodiment, the opening is directed upward.

In another embodiment, the first heat dissipation part is perpendicular to the second heat dissipation part.

In another embodiment, the silicon-controlled rectifier water-cooling heat dissipation device further comprises a water pump communicated with the cavity inlet pipe or the cavity outlet pipe.

In another embodiment, the plane at which the first heat dissipation part is located is perpendicular to the plane at which the second heat dissipation part is located.

In another embodiment, the heat dissipation plate is further provided with a grounding symbol and a grounding mounting hole.

In another embodiment, the silicon-controlled rectifier water-cooling heat dissipation device further comprises a circuit board accommodation cavity connected with the water-cooling cavity body. The silicon-controlled rectifier is electrically connected with a circuit board, and the circuit board and the silicon-controlled rectifier are accommodated in the circuit board accommodation cavity body.

The present disclosure provides a waterway system, comprising a waterway inlet end, an inlet water temperature sensor, the silicon-controlled rectifier water-cooling heat dissipation device as described above, an outlet water temperature sensor, and a waterway outlet end. which are communicated or connected in sequence.

According to the present disclosure, the heat from the silicon-controlled rectifier is transferred to the water-cooling cavity body through the heat dissipation plate. The heat dissipation part comprises the first heat dissipation part and the second heat dissipation part, and an occupied volume can be effectively reduced since the first heat dissipation part and the second heat dissipation part form an included angle. A water-cooling heat dissipation mode is adopted, and cold water takes away the heat from the silicon-controlled heating module by the flowability of water. Thus, the heat dissipation efficiency is improved, and an occupied space volume is further reduced. Meanwhile, the cold water can preheat the water temperature while taking away the heat from the silicon-controlled rectifier, and thus the power of water heating and saving electricity may be reduced.

BRIEF DESCRIPTION OF THE FIGURES

FIG. 2 is a combined view of the silicon-controlled rectifier water-cooling heat dissipation device according to the present disclosure;

FIG. 3 is a system schematic diagram of a waterway system according to the present disclosure; and FIG. 4 is a system schematic diagram of a waterway system according to another embodiment of the present disclosure.

DESCRIPTIONS OF REFERENCE NUMERALS

1—water-cooling cavity body; 101—cavity inlet pipe; 102—cavity outlet pipe; 103—opening; 2—heat dissipation plate; 21—first heat dissipation part; 211—first heat dissipation part mounting hole; 22—second heat dissipation part; 221—second heat dissipation part mounting hole; 23—grounding symbol; 24—grounding mounting hole; 25—heat dissipation plate bolt; 3—silicon-controlled rectifier; 31—silicon-controlled rectifier bolt; 32—silicon-controlled rectifier assembly; 33—silicon-controlled rectifier through hole; 4—circuit board accommodation cavity; 5—sealing ring; 6—circuit board; 7—waterway inlet end; 8—inlet water temperature sensor; 9—silicon-controlled rectifier water-cooling heat dissipation device; 10—outlet water temperature sensor; 11—waterway outlet end; 12—flowmeter and inlet water temperature sensor assembly; 13—heater assembly and outlet water temperature sensor assembly; 14—nozzle flushing assembly; and 15—controller.

DETAILED DESCRIPTION

The present disclosure is further described in detail hereinafter with reference to the accompanying drawings and the specific embodiments.

Embodiment 1

Figure 1:
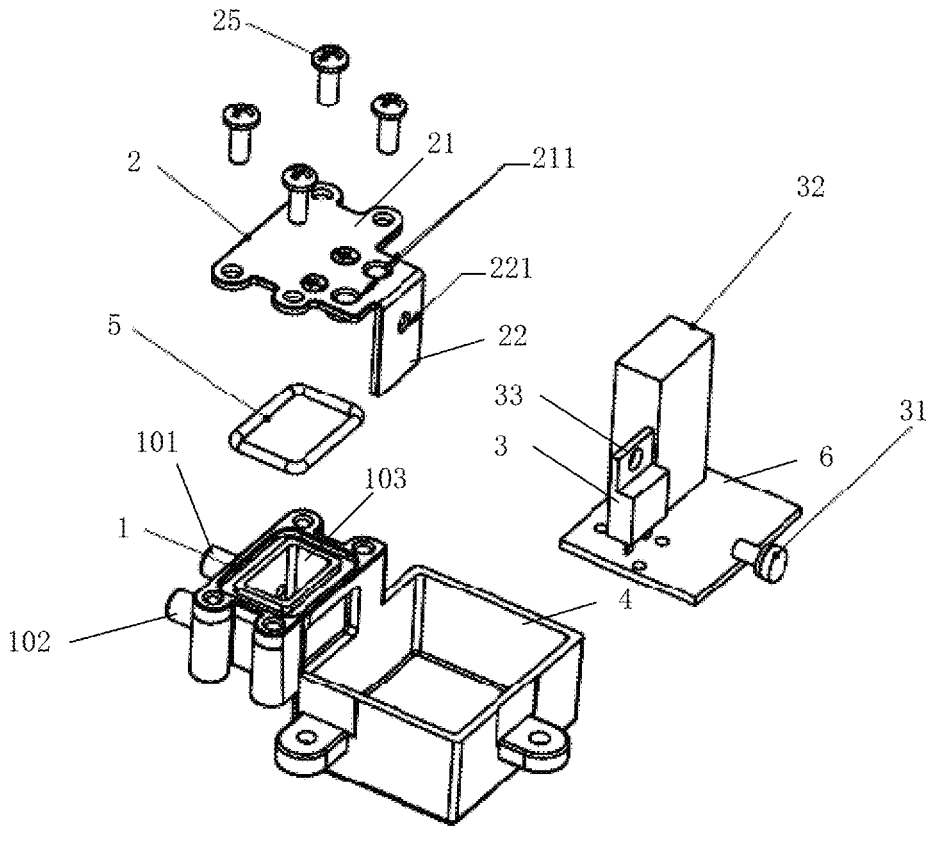
FIG. 1 is an exploded view of a silicon-controlled rectifier water-cooling heat dissipation device according to the present disclosure.

FIG. 1 shows a schematic structural diagram of a silicon-controlled rectifier water-cooling heat dissipation device according to the present disclosure. The silicon-controlled rectifier water-cooling heat dissipation device comprises a water-cooling cavity body 1, a metal heat dissipation plate 2, and a silicon-controlled rectifier 3. The heat dissipation plate 2 comprises a first heat dissipation part 21 and a second heat dissipation part 22, which are connected to each other. The first heat dissipation part 21 is in contact with the water-cooling cavity body 1. The second heat dissipation part 22 is in contact with the silicon-controlled rectifier 3. A preset included angle is formed between the plane where the first heat dissipation part 21 is located and a plane where the second heat dissipation part 22 is located.

Specifically, the water-cooling cavity body 1 is provided with the water-cooling cavity, and cooling liquid such as water is contained in the water-cooling cavity. The first heat dissipation part 21 of the metal heat dissipation plate 2 is in contact with the water-cooling cavity body 1, and the second heat dissipation part 22 is in contact with the silicon-controlled rectifier 3. Thus, the heat of the silicon-controlled rectifier 3 is transferred to the water-cooling cavity body 1 to complete the heat exchange.

The included angle is formed between the plane where the first heat dissipation part 21 is located and the plane where the second heat dissipation part 22 is located. In an embodiment, the plane where the first heat dissipation part 21 is located is perpendicular to the plane where the second heat dissipation part 22 is located. Because the included angle is formed between the plane at which the first heat dissipation part 21 is located and the plane at which the second heat dissipation part 22 is located, a cross section of the heat dissipation plate 2 is smaller, and thus the occupied volume may be reduced.

According to the present disclosure, the heat of the silicon-controlled rectifier is transferred to the water-cooling cavity body through the heat dissipation plate. The heat dissipation part comprises the first heat dissipation part and the second heat dissipation part, and the occupied volume can be effectively reduced since the first heat dissipation part and the second heat dissipation part form the included angle. A water-cooling heat dissipation mode is adopted, and cold water takes away the heat of a silicon-controlled heating module through the flowability of water. Thus, the heat dissipation efficiency is improved, and the occupied space volume is further reduced. Meanwhile, the cold water can preheat the water temperature while taking away the heat from the silicon-controlled rectifier, and thus the power of water heating may be reduced and electricity consumption may be saved.

Embodiment 2

FIG. 1 and FIG. 2 show schematic structural diagrams of a silicon-controlled rectifier water-cooling heat dissipation device according to one embodiment of the present disclosure. The silicon-controlled rectifier water-cooling heat dissipation device comprises a water-cooling cavity body 1, a metal heat dissipation plate 2, a silicon-controlled rectifier 3, and a circuit board accommodation cavity 4 connected with the water-cooling cavity body 1. The heat dissipation plate 2 comprises a first heat dissipation part 21 and a second heat dissipation part 22, which are connected to each other. The first heat dissipation part 21 is in contact with the water-cooling cavity body 1. The second heat dissipation part 22 is in contact with the silicon-controlled rectifier 3. A preset included angle is formed between a plane at which the first heat dissipation part 21 is located and a plane at which the second heat dissipation part 22 is located. The first heat dissipation part 21 is perpendicular to the second heat dissipation part 22.

The water-cooling cavity 1 comprises a cavity inlet pipe 101, a cavity outlet pipe 102, and a water-cooling cavity with an upward opening 103. The cavity inlet pipe 101 and the cavity outlet pipe 102 are respectively communicated with the water-cooling cavity 1. The first heat dissipation part 21 covers the opening 103. The silicon-controlled rectifier water-cooling heat dissipation device further comprises a sealing ring 5 arranged between the first heat dissipation part 21 and the opening 103. The heat dissipation plate 2 is further provided with a grounding symbol 23 and a grounding mounting hole 24.

The silicon-controlled rectifier 3 is electrically coupled to a circuit board 6, and the circuit board 6 and the silicon-controlled rectifier 3 are accommodated in the circuit board accommodation cavity 4.

Specifically, as shown in FIG. 1, the silicon-controlled rectifier water-cooling heat dissipation device of this embodiment comprises four major parts and two sets of screws. The water-cooling cavity body 1 and the copper heat dissipation plate 2 are sealed by the rubber sealing ring 5. The water in the water-cooling cavity body 1 exchanges heat with the silicon-controlled rectifier 3 through the heat dissipation plate 2. The second heat dissipation part 22 of the copper heat dissipation plate 2 is fixedly connected with the silicon-controlled rectifier 3 by a screw. For example, a silicon-controlled rectifier bolt 31 may pass through a silicon-controlled rectifier through hole 33 on the silicon-controlled rectifier 3 to connect a second heat dissipation part mounting hole 221. In an embodiment, an M3 screw thread is disposed on the second heat dissipation part mounting hole 221. The first heat dissipation part 21 of the heat dissipation plate 2 is fixedly connected with the water-cooling cavity body 1 by a screw, for example, by passing a heat dissipation plate bolt 25 through a first heat dissipation part mounting hole 211. In an embodiment, an M4 screw thread is disposed on the first heat dissipation part mounting hole 211.

As shown in FIG. 2, the silicon-controlled rectifier water-cooling heat dissipation device according to this embodiment provides two paths of water. The inlet water is supplied to the cavity inlet pipe 101 and is discharged by the cavity outlet pipe 102 after the heat exchange between the heat dissipation plate 2 and the silicon-controlled rectifier 3 in the water-cooling cavity body 1 is completed.

The circuit board 6 of the silicon-controlled rectifier 3 is accommodated in the circuit board accommodation cavity 4. The circuit board accommodation cavity 4 is connected with the water-cooling cavity body 1. A silicon-controlled rectifier assembly 32 may also be accommodated on the circuit board 6, such as a printed circuit board assembly (PCBA) connector.

The silicon-controlled rectifier heat dissipation module according to this embodiment uses a water-cooling heat dissipation mode, which has high efficiency occupies small space volume. Meanwhile, the silicon-controlled rectifier water-cooling heat dissipation device according to this embodiment integrates the water-cooling cavity body and the circuit board accommodation cavity together, and the metal heat dissipation plate is disposed between the water-cooling cavity body and the silicon-controlled rectifier to conduct heat. Thus, the heat dissipation is fast. In addition, the silicon-controlled rectifier and its water-cooling heat dissipation device are designed as an independent module, and thus there are few restrictions on the application site.

The silicon-controlled rectifier water-cooling heat dissipation device according to this embodiment can adjust the volume of the water-cooling heat dissipation cavity body according to different heating power and heat dissipation requirements, and the specific structural design can be correspondingly adjusted according to the actual need of different products.

Meanwhile, the heat dissipation plate of this embodiment is also designed with a grounding symbol and a threaded mounting hole with grounding reliability, which can be effectively connected with the grounding of the whole machine, and thus the system safety can be greatly improved.

In one embodiment, the silicon-controlled rectifier water-cooling heat dissipation device further comprises a water pump communicated with the cavity inlet pipe 101 or the cavity outlet pipe 102.

Specifically, a water exchange rate of the cavity inlet pipe and the cavity outlet pipe may also affect the efficiency of the water-cooling heat dissipation. Therefore, if the water heating power is high, it is necessary to improve the efficiency of the water-cooling heat dissipation, and a micro pump may also be added in a water inlet or outlet pipeline to accelerate the water replacement rate to achieve a higher water exchange rate. Thus, a higher heat dissipation effect for the heating components may be achieved.

Embodiment 3

FIG. 3 shows a system schematic diagram of a waterway system according to this embodiment. The waterway system comprises a waterway inlet end 7, an inlet water temperature sensor 8, the silicon-controlled rectifier water-cooling heat dissipation device 9 as described above, an outlet water temperature sensor 10, and a waterway outlet end 11, which are communicated or connected in sequence.

Specifically, the waterway inlet end 7, the inlet water temperature sensor 8, the silicon-controlled rectifier water-cooling heat dissipation device 9 as described above, the outlet water temperature sensor 10, and the waterway outlet end 11 are communicated or connected in sequence. The cavity inlet pipe 101 of the silicon-controlled rectifier water-cooling heat dissipation device 9 is communicated or connected with the inlet water temperature sensor 8, and the cavity outlet pipe 102 is communicated or connected with the outlet water temperature sensor.

The silicon-controlled rectifier water-cooling heat dissipation device 9 according to this embodiment is mounted at a rear end (e.g., an output end) of the inlet water temperature sensor 8, and thus the heat dissipation of the device has no influence on the collection of inlet temperature data. The device 9 is mounted at a front end (e.g., an input end) of the outlet water temperature sensor 10, and thus the unaffected collection of outlet temperature may be ensured. In this way, the change of inlet and outlet water temperature collection caused by module heat dissipation can be reduced to the greatest extent, and the precise temperature control of the whole waterway system can be ensured.

Due to the independent module characteristics, the silicon-controlled rectifier water-cooling heat dissipation device according to this embodiment may also be mounted at any position in the waterway according to the requirements of different occasions.

FIG. 4 shows a system schematic diagram of a waterway system according to another embodiment of the present disclosure. The waterway system comprises a waterway inlet end 7, a flowmeter and inlet water temperature sensor assembly 12, the silicon-controlled rectifier water-cooling heat dissipation device 9 as described above, a heater assembly and outlet water temperature sensor assembly 13, a nozzle flushing assembly 14, and a waterway outlet end 11, which are communicated or connected in sequence.

The silicon-controlled rectifier water-cooling heat dissipation device according this embodiment adopts a water-cooling mode for heat dissipation mode, which has high efficiency and occupies small space volume. Flexible modular mounting enables the device to be mounted at the rear end of the inlet water temperature sensor, which reduces the influence of the heat dissipation thereof on the water inlet temperature and is beneficial to the control of waterway water temperature. Separate and independent module is superior to the traditional way of being integrated on the water heating or main control board, and the maintenance cost thereof is low.

Embodiment 5

Figure 5:
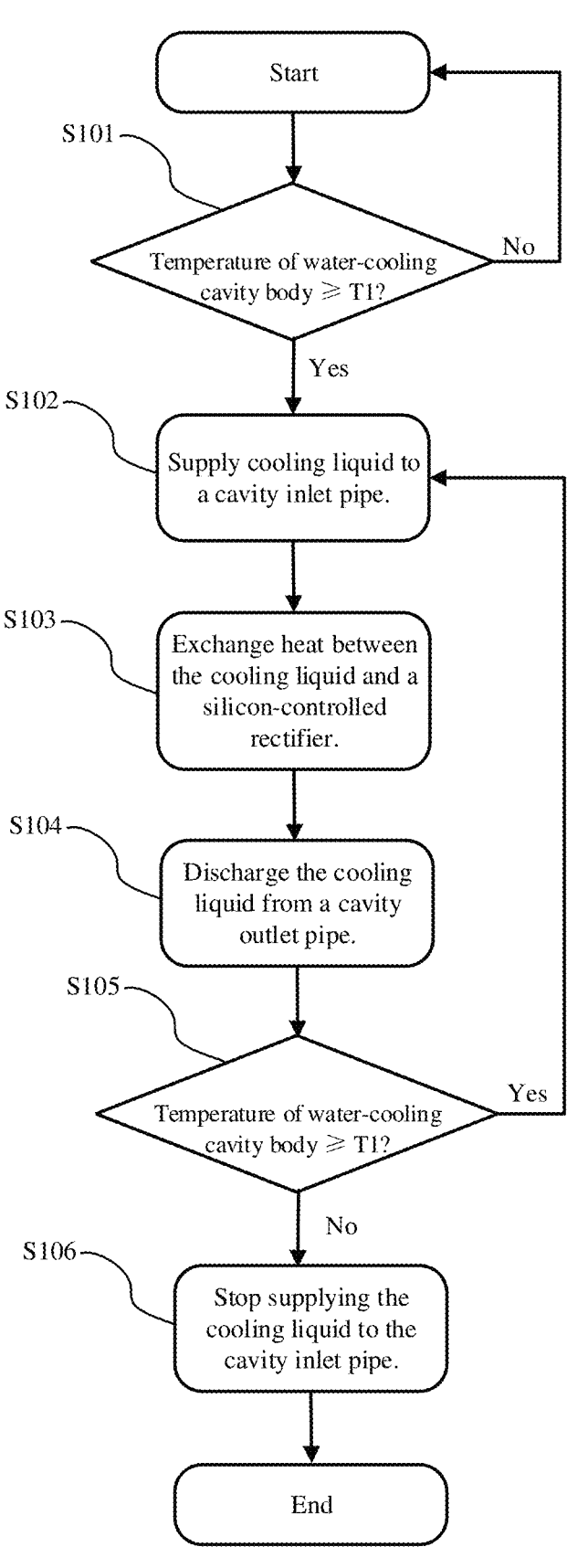
FIG. 5 is a flow chart of a method for cooling a silicon-controlled rectifier by using the silicon-controlled rectifier water-cooling heat dissipation device according to an embodiment of the present disclosure.
Figure 6:
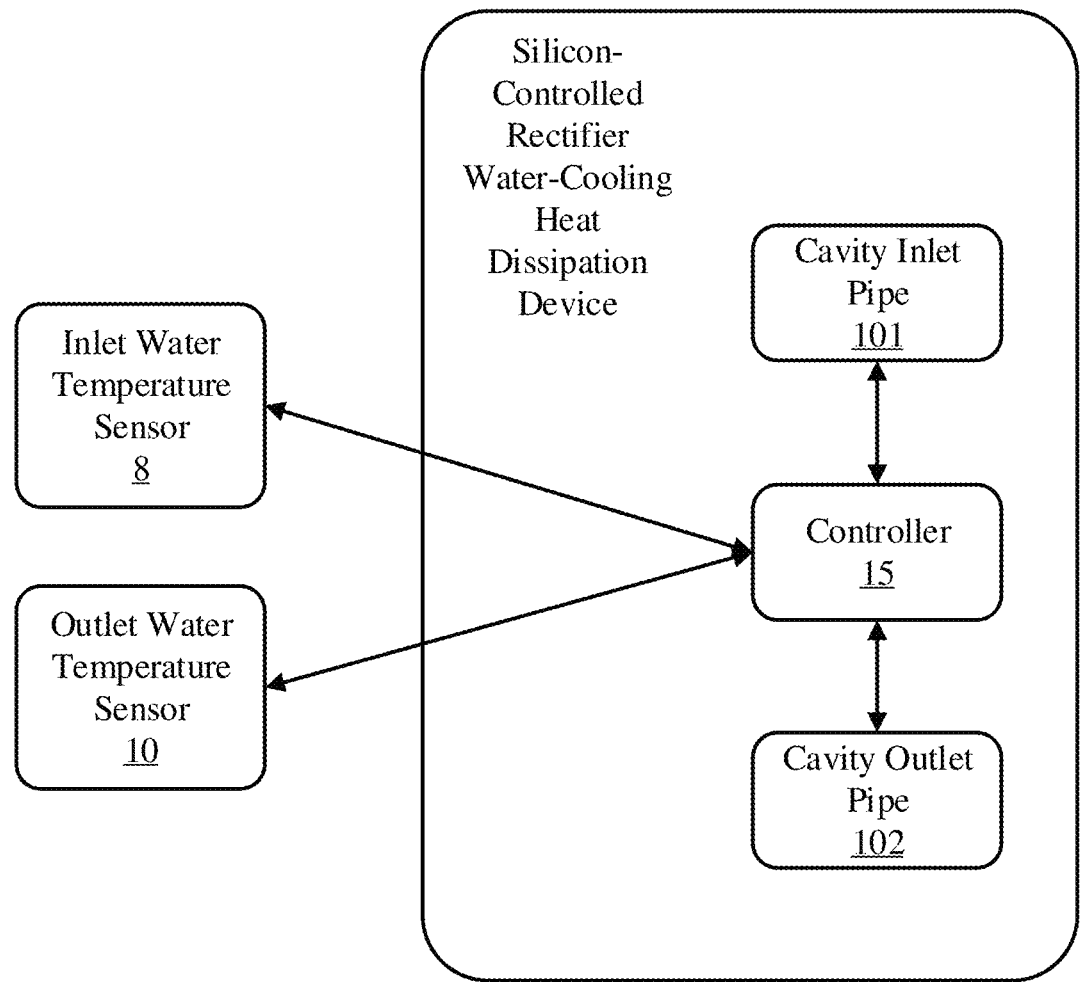
FIG. 6 is a block diagram illustrating a structure of the silicon-controlled rectifier water-cooling heat dissipation device according to an embodiment of the present disclosure.

FIG. 5 is a flow chart of a method for cooling a silicon-controlled rectifier by using the silicon-controlled rectifier water-cooling heat dissipation device according to an embodiment of the present disclosure. FIG. 6 is a block diagram illustrating a structure of the silicon-controlled rectifier water-cooling heat dissipation device according to an embodiment of the present disclosure. The silicon-controlled rectifier water-cooling heat dissipation device used by this method may be the silicon-controlled rectifier water-cooling heat dissipation device as discussed above.

As illustrated by FIG. 6, the silicon-controlled rectifier water-cooling heat dissipation device may further comprise a controller 15 electrically coupled to the cavity inlet pipe 101 and the cavity outlet pipe 102 and configured to control the cavity inlet pipe 101 and the cavity outlet pipe 102. The controller 15 may be further electrically coupled to the inlet water temperature sensor 8 and the outlet water temperature sensor 10 as discussed above.

The controller 15 in the present disclosure can be implemented by any appliances or by any software or applications run by the appliances. The controller 15 may be connected to a workstation or another external device (e.g., control panel, remote) and/or a database for receiving user inputs, system characteristics, and any of the values described herein. The controller 110 may include a processor. Optionally, the controller 15 may include an input device and/or a sensing circuit in communication with any of the sensors. The sensing circuit receives sensor measurements from as described above. Optionally, the controller 15 may include a drive unit for receiving and reading non-transitory computer media having instructions. Additional, different, or fewer components may be included. The processor is configured to perform instructions stored in memory for executing the algorithms described herein.

The processor may be a general purpose or specific purpose processor, an application specific integrated circuit (ASIC), one or more programmable logic controllers (PLCs), one or more field programmable gate arrays (FPGAs), a group of processing components, or other suitable processing components. Processor is configured to execute computer code or instructions stored in memory or received from other computer readable media (e.g., embedded flash memory, local hard disk storage, local ROM, network storage, a remote server, etc.). The processor may be a single device or combinations of devices, such as associated with a network, distributed processing, or cloud computing.

The method for cooling a silicon-controlled rectifier may be performed by the controller 15 as described above.

At act S101, the controller 15 may determine whether a temperature of the water-cooling cavity body 1 is equal to or higher than a predetermined temperature T1. The inlet water temperature sensor 8 may detect the temperature of the water-cooling cavity body 1 before the heat exchange.

The method for cooling the silicon-controlled rectifier returns to the start of the method for cooling the silicon-controlled rectifier when the controller 15 determines that the temperature of the water-cooling cavity body 1 is less than the predetermined temperature T1 (No in S101).

At act S102, the controller 15 may supply cooling liquid (e.g., water) to the cavity inlet pipe 101 when the controller 15 determines that the temperature of the water-cooling cavity body 1 is equal to or higher than the predetermined temperature T1 (Yes in S101). The supplied cooling liquid may be housed in the water-cooling cavity body 1. In another embodiment, the controller 15 may supply the cooling liquid according to an instruction from a user.

At act S103, the cooling liquid in the water-cooling cavity body 1 may exchange heat with the silicon-controlled rectifier 3 through the heat dissipation plate 2. As described above, the first heat dissipation part 21 and the second heat dissipation part 22 are connected to each other. The first heat dissipation part 21 is in contact with the water-cooling cavity body 1 the first heat dissipation part 21 is in contact with the water-cooling cavity body 1. The second heat dissipation part 22 is in contact with the silicon-controlled rectifier 3. Thus, the heat generated by the silicon-controlled rectifier 3 is transferred to the cooling liquid in the water-cooling cavity body 1 via the second heat dissipation part 22 and the first heat dissipation part 21.

At act S104, the controller 15 may discharge the cooling liquid from the cavity outlet pipe 102. After the heat exchange between the silicon-controlled rectifier 3 and the cooling liquid, a temperature of the cooling liquid may be increased. In this embodiment, the controller 15 may discharge the used cooling liquid while suppling the new cooling liquid. In another embodiment, the controller 15 may discharge the used cooling liquid according to an instruction from the user.

At act S105, the controller 15 may determine again whether the temperature of the water-cooling cavity body 1 is equal to or higher than the predetermined temperature T1. The outlet water temperature sensor 10 may detect the temperature of the water-cooling cavity body 1 after the heat exchange.

The method for cooling the silicon-controlled rectifier returns to act S103 to continue to supply the cooling liquid to the cavity inlet pipe 101 when the controller 15 determines that the temperature of the water-cooling cavity body 1 is equal to or higher than the predetermined temperature (Yes in S105).

At act S106, the controller 15 may stop supplying the cooling liquid to the cavity inlet pipe 101 when the controller 15 determines that the temperature of the water-cooling cavity body 1 is lower than the predetermined temperature (No in S105) and the method for cooling the silicon-controlled rectifier proceeds to the end of the method for cooling the silicon-controlled rectifier.

The above embodiments merely express several embodiments of the present disclosure, and the descriptions thereof are specific and detailed. However, the specific and detailed descriptions should not be understood as a limitation to the patent scope of the present disclosure. It should be noted that those of ordinary skill in the art may make a plurality of decorations and improvements without departing from the conception of the present disclosure, and these decorations and improvements shall all fall within the protection scope of the present disclosure. Therefore, the protection scope of the patent according to the present disclosure shall be subjected to the claims appended.

We claim:

1. A silicon-controlled rectifier water-cooling heat dissipation device, comprising:
  a water-cooling cavity body;
  a silicon-controlled rectifier; and
  a heat dissipation plate, comprising:
    a first heat dissipation part configured to contact the water-cooling cavity body; and
    a second heat dissipation part connected to the first heat dissipation part and configured to contact the silicon-controlled rectifier,
  wherein a preset included angle is formed between a plane where the first heat dissipation part is located and a plane where the second heat dissipation part is located.

2. The silicon-controlled rectifier water-cooling heat dissipation device according to claim 1,
  wherein the water-cooling cavity body comprises:
    a water-cooling cavity comprising an opening;
    a cavity inlet pipe connected to the water-cooling cavity; and
    a cavity outlet pipe connected to the water-cooling cavity; and
  wherein the first heat dissipation part covers the opening.

3. The silicon-controlled rectifier water-cooling heat dissipation device according to claim 2,
  wherein when cooling water is supplied to the water-cooling cavity body via the cavity inlet pipe, heat generated by the silicon-controlled rectifier is transferred to the cooling water in the water-cooling cavity body via the second heat dissipation part and the first heat dissipation part, and wherein the cooling water after the heat exchange with the silicon-controlled rectifier is discharged by the cavity outlet pipe.

4. The silicon-controlled rectifier water-cooling heat dissipation device according to claim 2, further comprising a sealing ring disposed between the first heat dissipation part and the opening.

5. The silicon-controlled rectifier water-cooling heat dissipation device according to claim 2, wherein the opening is directed upward.

6. The silicon-controlled rectifier water-cooling heat dissipation device according to claim 5, wherein the first heat dissipation part is perpendicular to the second heat dissipation part.

7. The silicon-controlled rectifier water-cooling heat dissipation device according to claim 2, further comprising a water pump connected to the cavity inlet pipe or the cavity outlet pipe.

8. The silicon-controlled rectifier water-cooling heat dissipation device according to claim 1, wherein the plane where the first heat dissipation part is located is perpendicular to the plane where the second heat dissipation part is located.

9. The silicon-controlled rectifier water-cooling heat dissipation device according to claim 1, wherein the heat dissipation plate further comprises a grounding symbol and a grounding mounting hole.

10. The silicon-controlled rectifier water-cooling heat dissipation device according to claim 1, further comprising a circuit board accommodation cavity connected with the water-cooling cavity body, wherein the silicon-controlled rectifier is electrically coupled to a circuit board, and wherein the circuit board and the silicon-controlled rectifier are disposed in the circuit board accommodation cavity.

11. The silicon-controlled rectifier water-cooling heat dissipation device according to claim 1, wherein the water-cooling cavity body is configured to house cooling liquid, and wherein heat generated by the silicon-controlled rectifier is transferred to the cooling liquid in the water-cooling cavity body via the second heat dissipation part and the first heat dissipation part.

12. A waterway system, comprising:

an inlet water temperature sensor connected to the waterway inlet end;

a silicon-controlled rectifier water-cooling heat dissipation device, connected to an output end of the inlet water temperature sensor;

an outlet water temperature sensor, connected to an output end of the silicon-controlled rectifier water-cooling heat dissipation device; and wherein the silicon-controlled rectifier water-cooling heat dissipation device comprises:

a water-cooling cavity body;

a silicon-controlled rectifier; and a heat dissipation plate, comprising:

a first heat dissipation part configured to contact the water-cooling cavity body; and a second heat dissipation part connected to the first heat dissipation part and configured to contact the silicon-controlled rectifier, wherein a preset included angle is formed between a plane where the first heat dissipation part is located and a plane where the second heat dissipation part is located.

13. The waterway system according to claim 12, wherein the water-cooling cavity body comprises:

a water-cooling cavity comprising an opening;

a cavity inlet pipe connected to the water-cooling cavity;

a cavity outlet pipe connected to the water-cooling cavity, and wherein the first heat dissipation part covers the opening.

14. The waterway system according to claim 13, wherein when cooling water is supplied to the water-cooling cavity body via the cavity inlet pipe, heat generated by the silicon-controlled rectifier is transferred to the cooling water in the water-cooling cavity body via the second heat dissipation part and the first heat dissipation part, and wherein the cooling water after the heat exchange with the silicon-controlled rectifier is discharged by the cavity outlet pipe.

15. The waterway system according to claim 13, wherein the water-cooling cavity body is configured to house cooling liquid, and wherein heat generated by the silicon-controlled rectifier is transferred to the cooling liquid in the water-cooling cavity body via the second heat dissipation part and the first heat dissipation part.

16. The waterway system according to claim 13, further comprising:

a waterway inlet end, connected to an input end of the inlet water temperature sensor; and a waterway outlet end, connected to an output end of the outlet water temperature sensor.

17. The waterway system according to claim 13, further comprising a nozzle flushing assembly, disposed between the outlet water temperature sensor and the waterway outlet end.

* * * * *